United States Patent [19]

Heimsch et al.

[11] 3,787,212

[45] Jan. 22, 1974

[54] POLYMERIC PHOTOSENSITIVE COMPOSITIONS AND METHODS USING SAME

[75] Inventors: Robert A. Heimsch, St. Louis, Mo.; John S. Bartosczewicz, Pennsacola, Fla.; Robert J. Slocombe, St. Louis, Mo.

[73] Assignee: Monsanto Company, St. Louis, Mo.

[22] Filed: Aug. 4, 1972

[21] Appl. No.: 277,964

Related U.S. Application Data

[63] Continuation-in-part of Ser. No. 40,417, May 25, 1970, abandoned.

[52] U.S. Cl. ................. 96/35.1, 96/36.2, 96/115 R, 96/115 P, 204/159.18, 204/159.24

[51] Int. Cl. ............................................ G03c 1/70

[58] Field of Search ............. 96/115 R, 115 P, 35.1; 204/159.18, 159.24

[56] References Cited

UNITED STATES PATENTS

| | | | |
|---|---|---|---|
| 3,380,831 | 4/1968 | Cohen et al. | 96/115 |
| 3,537,853 | 11/1970 | Wessells et al. | 96/115 X |
| 3,427,161 | 2/1969 | Laridon et al. | 96/115 X |
| 3,551,160 | 12/1970 | Bakes et al. | 96/115 |
| 3,169,868 | 2/1965 | Bordon | 96/90 |

FOREIGN PATENTS OR APPLICATIONS

| | | | |
|---|---|---|---|
| 614,181 | 2/1961 | Canada | 96/115 |

*Primary Examiner*—Ronald H. Smith
*Attorney, Agent, or Firm*—Joseph D. Kennedy et al.

[57] ABSTRACT

Photosensitive compositions of solid, solvent-soluble acrylonitrile/diene interpolymers with activated aromatic ketone sensitizers, e.g. polynuclear quinones, and applications as photoresists.

37 Claims, No Drawings

POLYMERIC PHOTOSENSITIVE COMPOSITIONS AND METHODS USING SAME

This application is a continuation-in-part of our copending application Ser. No. 40,417 filed May 25, 1970, now abandoned.

PHOTORESIST RESIN COMPOSITION

The present invention concerns particular alkenylnitrile/diene interpolymer photoresist coatings containing activated aromatic ketone sensitizers.

It is well known in the art of photoresists to utilize coatings of materials such as bichromated shellac, albumin, polyvinyl cinnamate and related unsaturated polymers on various supports such as metal plates as photoresist elements. When the coatings are exposed to light, the exposed areas become insolubilized and will not be washed off as the unexposed areas are upon solvent development. The relief image thus obtained may be dyed for use as a copy of the original, used for printing purposes, preparing milk-colored images, or it may be used as a resist for metal etching purposes as in chemical milling or production of printed circuit boards. In general prior art materials have suffered from various disadvantages. The bichromated gelatins are weak in resistance to water solutions of various strong etchants, and further suffer the disadvantage of all such bichromated materials of very limited shelf life, which requires that the bichromated sensitizers be stored separately from the polymers and mixed just prior to use. The polyvinyl cinnamate and related unsaturated ester polymers, although forming very strong and resistant films, have the disadvantage of undergoing excessive film shrinkage during any overexposure to actinic light and hence lack the accuracy in reproduction necessary for extremely fine detailed work. Moreover the polyvinyl cinnamate and related polymers are difficult to strip from substrates with common organic solvents. Some of the prior art materials also had objectionably long imaging times and poor film hardness.

SUMMARY OF THE INVENTION

In the present invention an alkenylnitrile/diene interpolymer having proper solubility and hardness characteristics is made photosensitive by addition of an activated aromatic ketone and employed as a photosensitive coating to make photoresists. The photosensitive coating becomes insolubilized upon exposure to light. By differential exposure, some areas of the coating are insolubilized while others remain soluble and can be removed by solvent development to form a relief image. The photographic relief images are of use in the graphic arts for printing plates, printed circuit boards, chemical milling etc., in the production of which an etchant is generally used to etch away the part of the substrate not covered by the relief, i.e., resist, image. The photosensitive composition, both before and after light exposure, is commonly referred to as a photoresist composition. The present compositions have short imaging time, good film hardness and lack of tack, suitably short development time with acceptable solvents, and exhibit proper overhang upon etching of the substrate with various etchants. The present coating compositions have acceptable shelf life making it possible to store the compositions after addition of the sensitizer. The coating compositions can be coated as a support and used as a non-tacky outer layer which can be allowed to directly contact an imaging mask.

The polymers utilized in the present invention are interpolymers of alkenyl nitriles and dienes in proportions such as to have proper hardness but yet be sufficiently soluble for use in coating solutions and for development by solvents. Utilizing acrylonitrile and isoprene as exemplary monomer pair, from about 32 to about 60 parts by weight of the polymer should be composed of units from acrylonitrile with 68 to 40 parts by weight of units from isoprene. The hardness of the polymer depends to a considerable extent upon the acrylonitrile content, with the polymer being objectionably soft and tacky below 32 parts acrylonitrile on the above basis, and a more narrowly prescribed range is 35 to 55 parts by weight units from acrylonitrile to 65 to 45 parts by weight units from isoprene, with a preference for at least 40 to 50 parts by weight from acrylonitrile and 50 to 40 parts by weight from isoprene. In fact there is a marked preference for utilizing at least 40 parts by weight acrylonitrile in order to avoid the polymer tack problem. In the acrylonitrile and butadiene as the pair, substantially the same proportions will be used, and other dienes or alkenyl nitriles can be substituted in such proportions. It is to be understood that when comparative parts by weight of monomer pairs are given herein, the total of the monomer pair in question will be 100 parts by weight. While low acrylonitrile polymers are poor in hardness and tack properties, such polymers may still be useful in some applications where this does not cause a problem.

Acrylonitrile/isoprene and the related polymers used herein are not in themselves light sensitive when compared to some other polymer systems. However it has been found that particular classes of light sensitizing agents will render such polymers light sensitive and in the high degree necessary for use as photoimaging elements. It appears to require particularly good light sensitizing agents to achieve the required sensitization, but even so the effect is specific to particular sensitizing agents since a number of classes of known strong sensitizers have been found unsuitable for sensitizing the acrylonitrile/diene polymers.

In the acrylonitrile/diene system, the sensitivity would be expected to come from the diene, and therefore high diene content might be expected to enhance sensitivity. However it has been found that polymers with high acrylonitrile content have higher sensitivity and require shorter exposure times. This is possibly due to lower initial solubility and therefore a lower need for cross-linking to achieve insolubilization. Polymers which are too high in acrylonitrile content are heat sensitive in the presence of effective light sensitizing agents, and are also too insoluble for use with usual development solvents, or for ready solution in coating solvents.

The interpolymers employed in the present invention can contain units from third or other monomers additional to the alkenyl nitrile and diene units, for example from styrene, vinyl toluene, methacrylates, and various other vinyl and ethylenically unsaturated monomers, etc., in various amounts, for example a small amount of styrene, a substantial amount of methacrylate, etc. The polymers can also contain more than one nitrile monomeric unit, or more than one diene unit, for example acrylonitrile can be employed along with a substantial amount of methacrylonitrile in combination with isoprene.

The dienes useful in the interpolymers explored herein include isoprene, butadiene, the pentadienes, cyclopentadienes, and hexadienes, e.g., 2, 3-dimethylbutadiene, and in general diene hydrocarbons containing up to six carbon atoms. Acrylonitrile copolymers with isoprene have been found to exhibit greater light sensitivity with the light sensitizers employed herein than do acrylonitrile copolymers with butadiene, and consequently the acrylonitrile/isoprene copolymers are preferred for use herein. The greater sensitivity makes it possible to use shorter exposure times than would otherwise be necessary. It can be theorized that the methyl side chain groups in the isoprene moiety, of the copolymer contribute to greater light sensitivity of the residual double bonds in the isoprene moiety, but the present invention is not to be limited to any particular theory, as the effect is present regardless of what its proper explanation may be.

Various alkenyl nitriles can be used as the alkenyl nitrile component of the interpolymers employed in the present invention. In general any of the alkenyl nitriles will convey suitable properties when present in the interpolymer, particularly those lower alkenyl nitriles having up to six carbon atoms, although interpolymers of suitable molecular weight and other structural characteristics are more readily prepared with some alkenyl nitriles than with others. Suitable olefinic nitriles include straight as well as branched chain nitriles, and nitriles with the olefinic group in various positions. The 2-alkyl acrylonitriles are preferred, e.g., 2-methylacrylonitrile, 2-ethylacrylonitrile, 2-propyl acrylonitrile, and 2-isopropylacrylonitrile, but such other nitriles as crotyl nitrile, allyl nitrile, can be used. The various alkenyl nitriles or mixtures thereof, can be combined in interpolymers with isoprene, butadiene, or the other hydrocarbon dienes disclosed herein, or mixture thereof, and such interpolymers with the proper monomeric proportions as taught herein can suitably be employed in photosensitive compositions in accordance with the present invention.

The essential constituents of the photosensitive compositions are the polymers as defined herein and the photosensitizers as defined herein, and the compositions consist essentially of these constituents. It is not necessary to have polymerizable, unsaturated monomers present to cause polymerization or cross-linking, or to have other catalysts or stabilizers or similar materials present although such may at times be advantageous; ordinarily the photosensitive layer contains no polymeric or polymerizable units other than those defined herein.

The interpolymers employed herein can be obtained by usual polymerization procedures, both batch and continuous procedures being suitable. Various polymerization catalysts are suitable, although redox catalysts are generally most suited to obtaining the high molecular weights desired. In practice continuous procedures will probably be employed as such are more suitable for obtaining reproducible results with respect to proportions of monomer content in the polymer, heterogeneity, molecular weight range, etc. In some cases a mixture of batch and continuous polymer may be used. In general the monomer contents herein have reference to the units from the particular monomers present in the polymer, although at times the proportions of monomers changed will be stated. In continuous polymerizations as conducted for preparing the polymers, the ratio of monomers charged is close to the ratio in the resulting polymer. However, in batch polymerizations which are not carried to complete conversion, there is considerable variance, of the approximate order stated below:

TABLE I

% Acrylonitrile Content

| Charge | In Polymer |
|---|---|
| 10 | 20 |
| 20 | 30 |
| 30 | 37 |
| 40 | 39 |
| 50 | 40 |
| 60 | 43 |
| 70 | 44 |
| 80 | 45 |
| 90 | 50 |
| 95 | 62 |

Thus it can be seen that in the ranges of primary interest herein, the acrylonitrile content in the polymer from batch polymerization will generally be less than that recorded as a monomer charge.

The photosensitizers employed herein are aromatic polynuclear compounds having intracyclic carbonyl groups and another intracyclic group selected from the group consisting of aza, thio, oxa, carbonyl and thio carbonyl groups. Such compounds can be represented by the formula:

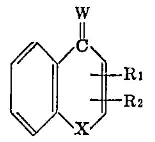

where W is selected from S and O, where X is selected from the group consisting of S, O and

N,
Q' where Q is selected from hydrogen and lower alkyl, and $R_1$ and $R_2$ each represents a member selected from the group consisting of hydrogen, halogen, alkyl, alkoxy, and together $R_1$ and $R_2$ represent the non-metallic atoms required to complete a fused benzene ring. Halogen can be any of the halogens and alkyl can, for example, be methyl, ethyl, propyl, isopropyl, butyl, amyl, hexyl, etc., and alkoxy can be any of the corresponding alkoxy groups. The carbonyl and thio or aza groups are preferably in the para position as illustrated, but can also be in the 1,2-position or other positions with respect to each other. Also, more than one additional benzene ring can be fused to the illustrated structure. Compounds useful as sensitizers in the present invention include the quinones, acridones and thioxanthones.

Compounds suitable for use include, for example, 2-methylanthraquinone, 1,2-benzanthraquinone, 10-thioxanthenone, 1,4-naphtho-quinone, 2-chlorothioxanthenone, 2,5-diphenyl-p-benzoquinone, 2,3-benzanthraquinone, 2-nitro-9, 10-phenanthraquinone, 2,3-diphenylanthraquinone, etc. In general quinones and related compounds known for photosensitizing activity will have some degree of activity with the resins employed in the present inventions, but some such sensitizers will have much greater activity than others. In general strong photosensitizers of the quinone type are more effective than weak ones, but the relative effectiveness of various quinones varies from that often found with other unsaturated systems, e.g., 2,3-dimethylanthraquinone has a relatively low order of sensitizing activity for the polymer systems employed herein, although it does definitely have activity. The activity also appears to be relatively low for 2,3-dichloronaphthoquinone, acridone, bianthrone.

A preferred class of sensitizers for use herein is the thioxanthones, particularly halo thioxanthones. Any halo groups are suitable, with the chloro, bromo and iodo being most convenient for use. The thioxanthones can also be substituted with alkyl or various other groups. The thioxanthones are particularly useful when used with other fluorescent dyes or agents capable of absorbing light and activating the thioxanthone sensitizer or otherwise acting as a useful adjuvant to the thioxanthone, e.g., various aromatic and furyl ketones such as acetophenone, benzil, furil, diaminodiphenyl ketones, fluorenone and benzophenone. These adjuvant agents in themselves need not, and ordinarily do not, exhibit a useful degree of sensitizing activity with the polymer systems employed herein.

The thioxanthones can be represented by the formula:

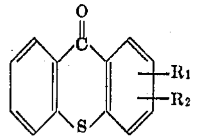

in which $R_1$ and $R_2$ can be any of the groups as defined hereinabove, and also other groups can be present, including additional aromatic-rings fused to the above structure. Another preferred class of sensitizing compounds for use herein are the anthraquinones, as represented by the structure:

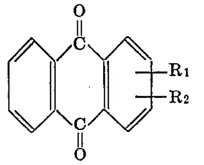

in which the $R_1$ and $R_2$ can be any of the groups as defined hereinabove, one of the particularly preferred compounds being benzanthraquinone in which $R_1$ and $R_2$ together complete a benzene ring. Other additional groups can also be substituted on the various rings.

For use as liquid compositions to be applied to various substrates, the photosensitive compositions employed in the present invention are generally dispersed in inert organic solvents. Ketone solvents are particularly suitable, especially those keto-alkanes having at least five carbon atoms, e.g., methyl-n-propyl ketone, methyl isopropyl ketone, methyl butyl ketone, ethyl-n-propyl ketone, ethyl isopropyl ketone, ethyl-n-butyl ketone, etc. The methyl butyl ketones are ordinarily preferred, although the higher molecular weight ketones may be advantageous when low volatility is especially necessary. Lower ketones such as acetone and methyl ethyl ketone can be used but volatility presents some problems. Organic esters can also be used as dispersing agents particularly when relatively more soluble polymers are used, or when dilute solutions are employed, for example such esters as propyl acetate, butyl acetate, amyl acetate, butyl butyrates, ethylene glycol monomethyl ether acetate, ethylene glycol monoethyl ether acetate, methyl aceto-acetate, ethyl acetoacetate, etc., and lower alkyl esters of aliphatic acids in general. Mono-chloro benzene can also be used.

The photoresist compositions in accordance with the present invention are useful in the production of printing plates, both mono- and bi-metallic plates, single and double-sided printed circuit boards, integrated circuits, the chemical milling of metals, and on any other substrates such as glass, ceramics, paper, textiles and polymer films which are treated with resinous photoresist compositions prior to processing by etchants either liquid or gaseous, textile printing, imaging and the like.

The photoresist compositions in accordance with the present invention can be coated by any of the known coating methods including spin coating, dip coating, flow coating, spray coating, roller coating or laminating as dry film. Generally the present photoresist compositions are coated to thicknesses ranging from about 0.1 to 10 microns, although thicknesses up to 25 microns or so may be used as dry film. The most preferred thickness of coating will depend to some extent on the intended further treatment of the substrate coated with the particular photoresist composition, including the nature of the etchant to be employed and the further plating, soldering or other steps intended to be carried out on the etchant substrate. In most cases other than dry film lamination it is generally preferable to use the present photoresist compositions in coating thicknesses of from about 0.2 to about 5 microns, especially about 1 to about 3 microns.

Generally the compositions of the present invention can be allowed to dry in air only to a sufficient hardness for exposure and further treatment. However with certain of the less volatile solvents named above it is preferred to subject the coated substrates to drying in a convection oven or other type oven with air flow. This can be suitably carried out at time of from 3 to 15 minutes at temperatures ranging from 45° to 100°C. This oven drying procedure is generally quite sufficient to render the coated polymer film thoroughly dry and sufficiently tough to be subjected to further processing.

The present photoresist compositions can be rendered partially or completely insoluble by exposure to actinic light. Any source of actinic light normally employed for imaging photosensitive compositions is suitable for imaging the present photoresist compositions. Such light sources as pulsed xenon lamps, ultraviolet or black light, mercury vapor lamps, carbon arc, incandescent bulbs or daylight can successfully be used. Because of the speed of exposure it is preferred to use one of the strong sources of light such as those first enumerated above. When incandescent bulbs or daylight is employed a longer exposure is usually required.

In order to develop the photo image created by exposure to actinic light the unexposed portions of the coated photoresist compositions are removed by suitable organic solvents. Such solvents should be chosen so as to afford complete removal after rinsing of the undeveloped portions of the photoresist while at the same time requiring only agitation of the solvent or the coated substrate and avoiding the necessity for abrasion, rubbing or otherwise mechanically removing the undeveloped photoresist polymer. Many types of organic solvents can be used for developing the images, including all those useful as dispersing solvents and detailed above. Preferred developing solvents are trichloroethylene and monochlorobenzene, and solvents such as trichloroethanes can also be used. While the polymers employed herein are relatively difficultly soluble, the other solvents such as those set forth herein as dispersing solvents can also be employed as developing solvents, although the development times wil in some instances be longer than ordinarily desirable, as the photosensitive coatings are relatively difficultly soluble.

The imaged or retained polymer can also be stripped from the support following an etching or other desired step. Methylisopropyl ketone is particularly effective as a stripping solvent, and it can also be used in admixture with trichloroethane, methylene chloride, or monochlorobenzene. Another effective stripping solution is a mixture of one part by weight dimethyl formamide with 2 parts by weight 25 percent aqueous sodium hydroxide. Methylene chloride and trichloromethylene can also be used as stripping solvents.

The photoresist compositions employed in the present invention have been found to be useful with all of the common etchants employed in the production of printing plates, printed circuit boards, integrated circuits, chemical milling of a large variety of metals, etching of glass, accurately printed designs of textiles and paper and a host of other uses on a variety of substrates. Thus compositions of the present invention are quite suitable for use in the commonly employed ferric chloride, ammonium persulfate or chromic acid etchants. Etching solutions of various compositions and strengths are used with copper and brass or bronze printing plates, copper clad printed circuit boards, zinc and aluminum printing plates, copper, brass, carbon steel, stainless steel, spring steel, nickel-iron alloys, such as Kovar, and the like, and other metals and alloys particularly suitable for producing chemically milled parts and shapes. Likewise the photoresist compositions can be used in fabricating relatively large area metal shapes such as aluminum wing spars and panels, stainless steel panels for aircraft and other such shapes produced by chemical milling procedures. The photoresist compositions have been found suitable for use with the various etching baths employed in the production of integrated circuit wafers such as polished silicon wafers subjected to etching by hydrofluoric acid and/or phosphoric acid and other similar strong etchants. Furthermore, the etching of glass by means of hydrofluoric acid and of certain integrated circuit materials by hydrofluoric acid or other strong etchant can also be successfully carried out with the photoresist compositions.

The photoresist compositions have likewise been found suitable for use on various substrate materials which are intended to undergo further treatments of various types. For example in the production of printed circuit boards, various procedures are employed wherein the copper clad board is first etched to produce the desired circuit pattern and thereafter coated with solder either on a single or both sides. Alternatively, prior to etching the developed board it may be plated with a different metal, including plating through for connections between two sides of a double-sided board. In other procedures an entire two-sided printed circuit panel board is first laminated with copper on both sides, resist coated, imaged, developed and thereafter plated with additional copper or a different metal with subsequent removal of the resist and etching away of the undesired copper laminate. The plating is effective over the metal where the resist has been developed and dissolved away only.

The photosensitizers employed herein will generally be used in amounts from about 2 to 20 percent by weight of the dry polymer content, and most commonly in amounts from 5 to 15 percent by weight. The polymer itself will generally constitute around 10 percent by weight of the coating solution, depending upon molecular weight, viscosity and similar factors, with the range varying from 5 to 20 percent or more by weight of coating solutions, with even higher amounts of solids being useful in some coating procedures.

If desired, various metal salts can be included in the compositions as accelerators for the photoreaction, and such salts may give advantages in some cases. Metal cations of the salts include such metals as cerium, molybdenum, manganese, iron, cobalt, nickel, zinc, cadmium, magnesium, tin, lead, silver, copper, calcium, potassium and sodium. The organic acids whose metal salts are useful as catalyst in the present compositions are the higher fatty acids such as oleic, linoleic, octanoic, naphthenic, stearic acids and the like. Also useful as metallic catalyst are the metallic chelates and enolates, such as the various above metal acetyl acetonates, the metal salts of ethylene diamine tetraacetic acid, ferrocene, and the like. The metal salt catalysts are present in the compositions in catalytic amounts, usually ranging from about 0.1 to about 10 percent by weight based on the polymer. The preferred range is from about 1 to about 5 percent by weight based on the weight of the polymer.

The resist coatings were generally prepared, imaged and coated as follows. A copper clad printed circuit blank (4 by 4 inches) was cleaned and dried. A 4 to 5 ml amount of the resist formulation was poured on the blank and the blank was subjected to spinning at 100 rpm for 3 to 5 minutes. The coating was dried for a few minutes at 90°C if necessary, and the coating thickness measured by a Betascope. The coating was exposed through a mask and a stepwedge to light of a designated source for a designated time. The image was developed by a solvent in a spray developer for 1 minute, and the retained coating thickness was measured. The number of steps retained on the step wedge was now determinable. The blank was then passed through a conveyorized etcher containing 38°–40°Be $FeCl_3$ for etching the exposed metal at 120° to 130°F, with a sojurn time of the order of 60 to 80 seconds. The board was then rated for definition of the image on a scale from 1 to 5 as follows:

1. Very good board
2. Some minor pinholing or wavy lines
3. Bad breaks, uneven lines, but image recognizable
4. Very little image remaining, not recognizable
5. No image retained If the metal support were aluminum, a basic solution such as sodium hydroxide is used for etching, and the present coating compositions are resistant to caustic solutions as well as to ferric chloride and other usual etching solutions, including the ammonium fluoride-hydrofluoric acid type of etchants used to etch glass, silicon, etc.

Actinic light in general can be usefully employed for exposing the photosensitive compositions utilized herein, although the efficiencies of various wave lengths will vary somewhat with the particular photosensitizers utilized. In practice the usual light sources employed for imaging in the graphics arts are used. For example a 4000 watt pulsed xenon lamp 30 inches from the surface to be imaged, a 400 watt mercury vapor lamp (Colite) at 17 inches, or a Chemcut Printer with fluorescent black lights at 3½ inches. The Chemcut Printer has 200 watt banks of lights on each side of the exposure position, but in the case of a small circuit board blank, only a small portion of the banks would be in position to irradiate the blank effectively. The degree of imaging necessary to have much practical value in most photoresist applications is that shown by a rating of 5 or 6 steps on the Stouffer 21-step step wedge scale, and this should be obtained within 30 seconds from the pulsed xenon, 2 minutes with the mercury vapor lamp, and 4 minutes in the Chemcut Printer. Of course, compositions failing to meet these criteria may still have some useful photosensitivity in less demanding types of applications.

The following examples are illustrative of the invention.

EXAMPLE 1

A solution was prepared of 1 part by weight 1,4-naphthoquinone to 20 parts by weight chloroform, and 2 parts by weight of the solution was added to 10 parts by weight of a 10 percent by weight solution of an acrylonitrile/isoprene copolymer in methyl butyl ketone. The polymer contained 34 parts by weight of acrylonitrile units to 66 parts by weight isoprene units. A board was coated with the formulation and exposed through a step wedge for 4 minutes in a Chemcut Printer. The coating was developed in toluene and held 2 steps on the step wedge scale. Similarly, 1 minute exposure to a mercury vapor lamp gave 9 steps, 1 minute to a pulsed-xenon gave 5 steps, and 4 minutes to a pulsed-xenon gave 10 steps.

EXAMPLE 2

A photopolymerizable composition was prepared from an acrylonitrile/isoprene copolymer obtained by batch polymerization of a charge containing 70 parts by weight acrylonitrile to 30 parts by weight isoprene. The copolymer was dissolved to form a 10 percent by weight solution in a mixture of 60 parts by weight chlorobenzene with 40 parts by weight butyl acetate. Different sensitizers were then added, to give one solution containing 1 percent by weight 2-chlorothioxanthone and 1 percent by weight benzophenone, and another solution containing 1 percent by weight 1,2-benzanthraquinone, i.e., benzanthracene 7,12-dione. Copper clad printed circuit blanks were coated with the solutions, and oven-dried for 5 minutes at 90°C, to give film thicknesses of 1 to 1.5 microns. The following Table reports results for two coatings.

TABLE II

| | Chlorothioxanthone/benzophenone | Benzanthraquinone |
|---|---|---|
| Pencil Hardness | | |
| As deposited, heat | 5–6 | 5–6 |
| As oven-dried 3 min. at 90°C | 5–6 | 5–6 |
| Image Speed, Steps | | |
| 1 minute pulsed xenon | 11.5 | 8 |
| 2.5 minutes Chemcut UV | 5.5 | 4 |
| Development Time, minutes for 1 minute pulsed xenon image using cold trichloroethylene spray | 1–1.5 | 1–1.5 |
| Pinholing | None | None |
| Overhang, mm. | 0.02 | 0.02 |
| Resolution | Good | Good |
| Adhesion (Scotch tape test) | Good | Good |
| Pre-Plating Bake | | |
| Time, Min. | 10 | 5 |
| Temp., °C | 120 | 90 |
| Plating Bath Resistance, pulsed xenon exposure | | |
| Cu pyrophosphate | No. 1 Board | No. 1 Board |
| Cu fluoborate | No. 1 Board | No. 3 Board |
| Ni sulfamate | No. 1 Board | No. 1 Board |
| Gold cyanide | No. 1 Board | No. 1 Board |
| Lead-tin | No. 1 Board | No. 2 Board |
| Film retention in development | 55–60% | 60–70% |

EXAMPLE 3

A solution in methyl isobutyl ketone was prepared with 8 percent by weight of acrylonitrile/isoprene copolymer in which the acrylonitrile content as polymerizate was 34 percent by weight. Sensitizers were added in the indicated weight amounts, based on polymer, and circuit boards were coated and oven dried for the indicated times. The coatings were exposed to a pulsed xenon lamp (4,000 watt at 30 inches) for the indicated times through an imaging mask and/or step wedge and then developed with a butyl acetate spray to produce a visible image. After etching with ferric chloride, the boards were rated on the 1 to 5 scale given previously, or by steps on a step wedge. If desired, the image can be made more readily visible by dying in a photo-resist dye bath.

TABLE III

| Sensitizer and % | Exposure Time | Thickness, microns Before devel. | After devel. | Drying Time, Minutes | Rating |
|---|---|---|---|---|---|
| 10% benzanthraquinone | 15 sec. | 3.09 | 1.35 | 3 | 1 |
| 10% benzanthraquinone | 1 min. | 3.09 | 1.79 | 3 | 1 |
| 10% naphthoquinone | 1 min. | 2.74 | 1.45 | 3 | 2 |
| 10% methylanthraquinone | 1 min. | 3.09 | 1.22 | 3 | 1 |
| 10% methylanthraquinone | 30 sec. | 3.21 | 1.05 | 3 | 1 |
| 15% methylanthraquinone | 30 sec. | 3.33 | 1.03 | 10 | 2 |
| 10% benzanthraquinone | 15 sec. | 3.09 | 1.27 | 10 | 1 |
| 10% methylanthraquinone with 10% benzil | 1 min. | — | — | 3 | 10 steps |
| 10% methylanthraquinone with 10% benzophenone | 1 min. | — | — | 3 | 10 steps |
| 10% methylanthraquinone | 1 min. | — | — | 3 | 9 steps |

Formulations of the above type also exhibited good shelf life. While the imaging times and other reported properties are good, the imaging time is slower than that of higher acrylonitrile content polymers, and the above polymer composition is also somewhat more tacky than desirable, as the tackiness causes a problem of imaging films or masks sticking to the coating surface so that the imaging process is carried out with less facility.

EXAMPLE 4

A 12 percent solution of acrylonitrile/isoprene copolymer in methyl butyl ketone was made up to have 10 percent by weight (based on the polymer) of 1,4-naphthoquinone. A circuit board was coated, whirl dried for 5 minutes, and exposed through a step-wedge to a pulsed xenon lamp for 1 minute. After solvent development, 4 steps on the wedge scale were retained. The procedure was repeated but with 3 minutes drying at 90° C. after coating, and with a 2 minute exposure in a Chemcut Printer, to retain 6 steps on the wedge scale. The copolymer used was prepared from a charge 70 parts by weight acrylonitrile to 30 parts by weight isoprene.

EXAMPLE 5

An acrylonitrile/isoprene copolymer prepared from a 70 to 30 weight charge was formulated with 10 percent by weight chlorothioxanthenone and 10 percent by weight benzophenone, and exposed under a step wedge for 2 minutes to a blacklite fluorescent ultraviolet lamp (Chemcut) at 3½ inches. Upon development, 4 steps were retained on the step wedge scale. When 4% copper octoate was added to the formulation, 5 steps were retained. With pulsed xenon lamp exposure for 15 seconds, the copper octoate improved the rating from 5.5 steps to 7 steps.

EXAMPLE 6

A formulation which has been found particularly suitable for forming photosensitive coatings is:

8 grams acrylonitrile/isoprene copolymer of high acrylonitrile content
0.4 gram benzophenone
0.4 gram 2-chlorothioxanthone
92 grams methyl n-butyl ketone

EXAMPLE 7

An acrylonitrile/isoprene copolymer having 34 percent by weight acrylonitrile content was dissolved in butylacetate to form a 10 percent solution, and 10 percent by weight of methylanthraquinone, based on polymer, was added. A support was spin coated and exposed through a step wedge under a pulsed xenon lamp for 1 minute to produce an image, after solvent development, which retained 8 steps on the step wedge scale.

EXAMPLE 8

A 10 percent solution in methyl butyl ketone was formed from an acrylonitrile/isoprene copolymer to contain 10 percent by weight on the polymer of benzanthraquinone. The copolymer was prepared from a charge of 70 parts acrylonitrile to 30 parts isoprene. A 3.4 micron coating of the material was exposed for 30 seconds under a pulsed xenon lamp, and upon development by methyl butyl ketone spray held 9 steps on the step wedge scale. The coating thickness after development was 2.2 microns. A 2 minute mercury vapor exposure also gave a 9 step rating and a 1.9 micron thickness after development.

EXAMPLE 9

A 10 percent by weight solution of acrylonitrile/isoprene copolymer containing 10 percent by weight on the polymer of benzanthraquinone was used to whirl coat a support which was then dried in a convection oven for 3 minutes at 90°C. The copolymer had an acrylonitrile content of 34 percent. The coating was exposed through a printed circuit mask and step wedge for 30 seconds under a pulsed xenon lamp. This was followed by development with toluene and etching to give a good image and 10 steps on the wedge scale. Similarly, a 2 minute exposure in a Chemcut Printer gave a good image and a 6 step rating.

EXAMPLE 10

A methyl butyl ketone solution was prepared containing 10 percent by weight of acrylonitrile/butadiene copolymer having a 50:50 weight ratio of acrylonitrile units to butadiene units. Chlorothioxanthone and benzophenone were each added in amounts constituting 10 percent by weight of the polymer, and copper octoate was added in an amount 2½ percent by weight of the polymer, along with an antioxidant stabilizer in less than 1 percent by weight on the polymer. Circuit blanks were spin coated with the material and the coatings were dried at 120°C for 5 minutes. The blanks were exposed to light, developed and etched with the results reported below:

TABLE IV

| Exposure | | Development | | Thickness, microns | | Board Rating | Steps |
|---|---|---|---|---|---|---|---|
| Light | Time | Solvent | Time | Initial | Final | | |
| Colite | 2 min. | butylethyl ketone | 40 sec. | 3.23 | 2.13 | 1 | 6.5 |
| Colite | 4 min | butylethyl ketone | 40 sec. | 3.14 | 2.45 | 1 | 7 |
| Chemcut | 4 min | butylethyl ketone | 40 sec | 3.14 | 2.13 | 1.5 | 4.5 |
| Pulsed Xenon | 1 min | butylethyl ketone | 40 sec. | 3.06 | 2.38 | 1 | 6.5 |
| Colite | 4 min. | methyl butyl ketone | 2 min. | 3.23 | 2.77 | 1 | 7.5 |

The overhang width and regularity was also very good.

EXAMPLE 11

A methyl butyl ketone solution was prepared containing 10 percent by weight of an acrylontrile/isoprene copolymer having 40.1 percent by weight of acrylonitrile units as determined by nitrogen analysis. Chlorothioxanthone and benzophenone were added as sensitizers in 5 percent by weight of each based on the polymer, and a 2 percent amount, based on polymer, of copper octoate was added. An anti-oxidant was also added in an amount less than 2 percent by weight of the polymer. Circuit blanks were coated with the material and dried at 90°C for five minutes. Exposure under a Colite lamp for 2 minutes and development with trichloroethylene for 45 seconds gave good images holding 8 steps on the step wedge scale, and upon etching boards with a No. 1 rating and good overhang were produced.

EXAMPLE 12

An acrylonitrile/isoprene copolymer was found by analysis for unsaturation to have 51.2 percent by weight isoprene units, and by difference 48.8 acrylonitrile units. A coating solution in methyl butyl ketone was prepared containing 10 percent by weight of the polymer of chlorothioxanthone and 10 percent by weight of the polymer of benzophenone. A circuit blank was spin coated at 35 rpm to give a 2.7 micron coating, which was imaged 2 minutes with a Colite lamp. Upon development with trichloroethylene for 45 seconds, an image was obtained with a rating of 8 steps on the step wedge scale. The coating had a 1.8 micron thickness after development. Upon etching with ferric chloride solution, the board had a No. 1 rating, and showed good overhang. The coating had good hardness and was free from objectionable tack.

EXAMPLE 13

A 1:1 solvent mixture of ethyl butyl ketone and ethylene glycol monomethyl ether acetate was prepared containing 20 percent by weight of an acrylonitrile/methacrylonitrile/isoprene terpolymer containing 47 percent by weight acrylonitrile and 8 percent by weight methacrylonitrile, the balance being isoprene. 2-chlorothioxanthone and furil were added as sensitizers in 2.5 percent and 7.5 percent by weight of each respectively based on the polymer and a 1.0 percent amount, based on the polymer of copper octoate was added. An anti-oxidant was also added in an amount of less than 2 percent by weight of the polymer. Circuit blanks were coated with the material and dried at 120°C for 5 minutes. Exposure under a pulsed xenon lamp for 1.0 minute and development with Freon TMC solvent (52 percent 1,2,2-trichloro-1,2,2-trifluoroethane, 48 percent methylene chloride) gave images holding 10 steps on the step wedge and upon etching, boards with a number 1 rating and good overhang.

EXAMPLE 14

An acrylonitrile/isoprene copolymer was found by analysis for unsaturation to have 51.2 percent by weight isoprene units, and by difference 48.8 percent acrylonitrile units. A coating solution in methyl butyl ketone was prepared containing 15 percent by weight of the polymer of furil and 5 percent by weight of the polymer of 2-chlorothioxanthone. A circuit blank was spin coated to give a 3.5 micron coating, which was imaged for 1 minute under a pulsed xenon source. Upon development with trichloroethylene for 1 minute, an image was obtained with a rating of 9 steps on the step wedge scale. The coating had a thickness of 2.1 microns after development. Upon etching with ferric chloride solution, the board had a No. 1 rating and showed good overhang. The coating had good hardness and was free from objectionable tack.

EXAMPLE 15

The procedure of Example 14 was repeated but with xanthen-9-one in place of the furil, to give similarly good results.

EXAMPLE 16

The procedure of Example 14 was repeated but with 9-fluorenone in place of furil, to give similarly good results.

EXAMPLE 17

The procedure of Example 14 was repeated but with benzil in place of furil, to give similarly good results.

There can be an advantage in using a third monomer such as methacrylonitrile in the photoresist compositions. As discussed hereinabove, acrylonitrile tends to improve solvent resistant and hardness, but also to affect solvent developability so that there is an upper limit on desirable acrylonitrile content for use with some solvent developers. Isoprene contributes to solubility, but tends to cause a tacky surface if particular percentages are exceeded, and this is undesirable in some applications. Methacrylonitrile tends to give more solubility than acrylonitrile, but replacement of a portion of the acrylonitrile in a terpolymer does not result in a tacky surface. The third monomer, including methacrylonitrile, can be used in various proportions, but in general desired effects can be achieved with about 1 to 12 parts by weight in the polymer in conjunction with the ranges of other monomers prescribed herein. The methacrylonitrile content can very suitably be, for example, 8 to 12 parts by weight, with 42 to 47 parts by weight of acrylonitrile and 40 to 45 parts by weight of isoprene or other diene. The same sensitizers are applicable to this terpolymer, and to the classes of terpolymers and interpolymers disclosed herein, as to copolymers.

EXAMPLE 18

A roller coating formulation was made from an acrylonitrile/methacrylonitrile/isoprene polymer having approximately the monomer ratios of Example 13. The polymer had a high molecular weight fraction making it particularly suitable for roller coating application. The formulation contained about 18 percent by weight solids in a 1:1 weight mixture of ethyl butyl ketone and ethyl cellusolve acetate, and had a viscosity of 1,290 centistokes. The formulation exhibited stability upon use in roller coating and gave a smooth coating without any orange peel appearance. A formulation containing 10 parts chlorothioxanthone and 10 parts benzophenone, by weight on the polymer, was coated and used for photoimaging. When subjected to 1 minute exposure under pulsed xenon, the coating held 6 steps on the step wedge scale, and 60 percent retention (by thickness) of the image in solvent development. Roller coating formulations have special requirements in that it is desirable to have high solids content of the order of 15 to 20 percent by weight or higher, but without undue increase in viscosity. In general, such formulations can have viscosities in the range of 1,200 to 2,000 centistokes. Since this formulation was at the lower end of the viscosity scale, it is apparent that its viscosity could suitably be increased to over 20 percent solids. The polymer in the formulation has a molecular weight distribution such that it can, if desired, be used to build up a coating thickness of 4 to 7 microns or greater. The polymer is characterized as having some very high molecular weight microgel, and some lower molecular weight soluble polymer. The high molecular weight material provides a large number of functional sites for the photosensitized reaction, and also contributes to low solubility because the polymer is in the form of particles in an organosol. The lower molecular weight fraction permits the production of smooth coatings which can be built up to desired thicknesses. The high molecular weight material constitutes about 50 to 90 percent of the polymer and has a particle weight corresponding to at least 3,000,000 molecular weight units, and generally 10,000,000 to 20,000,000 or higher molecular weight units. The polymer can be pictured as of random coil structure with cross-linking to give a three dimensional net work. The polymer contains 10 to 50 percent of lower molecular weight material, which is generally in the range of 50,000 to 300,000 molecular weight, with an 150,000 average molecular weight.

The polymer above was obtained by aqueous emulsion polymerization with a redox catalyst, followed by coagulation and incorporation into an organic solvent system. The polymerization utilized an initial monomer charge, and then a monomer feed in the proportions desired in the polymer, with an initiator including a hydroperoxide and ferrous ammonium sulfate along with dodecyl mercaptan, sodium versenate and sodium lauryl sulfate emulsifier. The emulsion was coagulated with methanol, and most of the methanol removed from the coagulate before incorporation into an organic solvent to form an organosol.

All of the polymer systems, sensitizers etc. within the present disclosure can usefully be employed in organosols with the foregoing molecular weight ranges to make and photoimage coatings, and, in fact, such organosols are useful with any photosensitizing systems capable of effecting photoimaging of the polymers employed.

As noted hereinabove, the present photosensitive compositions do not require the presence of any unsaturated monomers or similar photopolymerizable materials. It follows that the image-forming process involves some mechanism for forming links between chains of alkenylnitrile/diene polymer in areas of the image exposed to light, whether by direct bonding of chain carbon atoms, or through some intermediary such as benzophenone or other co-sensitizer, and is not dependent upon cross-links formed from compounds containing pendant vinylidene or similar addition polymerizable groups.

Various modifications and uses of the invention will occur to those skilled in the art in the light of the foregoing disclosure.

We claim:

1. A light sensitive element comprised of a support coated with a non-tacky outer layer comprising a solid, non-tacky solvent-soluble interpolymer of an alkenyl nitrile and a hydrocarbon diene, and a photosensitizer which is an aromatic polynuclear compound having at least one intracyclic carbonyl group and another intracyclic group selected from the group consisting of sulfur, oxygen carbonyl, thio carbonyl and aza groups.

2. The element of claim 1 in which the polymer has 32 to 60 parts by weight of alkenyl nitrile units per 68 to 40 parts by weight units from hydrocarbon diene and the said layer contains no other polymeric or polymerizable units.

3. The element of claim 2 in which the alkenyl nitrile is acrylonitrile.

4. The element of claim 3 in which the hydrocarbon diene is selected from the group consisting of isoprene and butadiene.

5. The element of claim 3 in which the hydrocarbon diene is isoprene.

6. The element of claim 2 in which the photosensitizer is a polynuclear quinone.

7. The element of claim 2 in which the photosensitizer is a thioxanthenone.

8. The element of claim 4 in which the photosensitizer is 2-chlorothioxanthone and benzophenone.

9. The element of claim 4 in which the photosensitizer is benzanthraquinone.

10. The element of claim 4 in which the interpolymer has 40 to 50 parts by weight units from acrylonitrile to 60 to 50 parts by weight units from butadiene or isoprene and the layer is relatively difficultly soluble.

11. The element of claim 1 in which the polymer has 40 to 60 parts acrylonitrile, 1–12 parts methacrylonitrile, and 40–50 parts isoprene.

12. A photosensitive composition comprising an interpolymer of an alkenylnitrile and a hydrocarbon diene and a chlorothioxanthone.

13. The composition of claim 12 in which benzophenone is also present.

14. The composition of claim 12 in which furil is also present.

15. The element of claim 12 in which xanthen-9-one is also present.

16. The element of claim 12 in which 9-fluorenone is also present.

17. The element of claim 12 in which benzil is also present.

18. The composition of claim 12 in which the interpolymer is of acrylonitrile and isoprene and has 32 to 60 parts by weight of acrylonitrile units to 68 to 40 parts by weight of isoprene units.

19. The composition of claim 12 in which the interpolymer is of acrylonitrile and butadiene and has 32 to 60 parts by weight of acrylonitrile units to 68 to 40 parts of butadiene units.

20. A photosensitive composition consisting essentially of an interpolymer of acrylonitrile and a hydrocarbon diene selected from the group consisting of isoprene and butadiene, and 5 to 15 percent by weight of the interpolymer of benzanthraquinone, the interpolymer having 32 to 60 parts by weight of acrylonitrile units to 68 to 40 parts by weight of units from hydrocarbon diene.

21. A photosensitive coating composition consisting essentially of a solid, non-tacky solvent-soluble interpolymer of an alkenyl nitrile and a hydrocarbon diene, and a photosensitizer which is an aromatic polynuclear compound having at least one intracyclic carbonyl group and another intracyclic group selected from the group consisting of sulfur, carbonyl and aza groups and a solvent selected from the group consisting of aliphatic ketone solvents and aliphatic ester solvents.

22. The coating composition of claim 21 in which the interpolymer is an interpolymer of acrylonitrile and isoprene with 40 to 50 parts by weight acrylonitrile units to 50 to 40 parts by weight isoprene units, and the photosensitizer is selected from the group consisting of polynuclear quinones and thioxanthones, and the interpolymer comprises 5 to 20 percent by weight of the composition and the photosensitizer 5 to 15 percent by weight of the interpolymer.

23. The coating composition of claim 21 in which chlorothioxanthone is the photosensitizer and benzophenone is also present.

24. A photosensitive composition consisting essentially of an interpolymer selected from the group consisting of acrylonitrile isoprene interpolymers and acrylonitrile butadiene interpolymers and at least 5 percent by weight on the interpolymer of a photosensitizer, in which a compound selected from the group consisting of polynuclear quinones and thioxanthones is used as photosensitizer.

25. A relatively difficultly soluble photosensitive composition consisting essentially of acrylonitrile/diene interpolymer selected from the group consisting of acrylonitrile/isoprene interpolymers and acrylonitrile/-butadiene interpolymers with a weight content of 40 to 50 parts by weight acrylonitrile units to 60 to 50 parts by weight diene units, and at least 5 percent by weight of a photosensitizer selected from the group consisting of polynuclear quinones and thioxanthones.

26. The composition of claim 25 in which the polymer is 42 to 47 parts by weight acrylonitrile, 40 to 45 parts by weight isoprene and 8 to 12 parts by weight methacrylonitrile.

27. The method of photoimaging comprising a. applying to a surface of a support a coating layer to form a light sensitive element as defined in claim 1, b. placing a mask in cooperative relationship with respect to such coating layer, and c. exposing said mask to actinic light, thereby changing the solubility characteristics of exposed portions of said coating layer.

28. The method of claim 27 in which unexposed portions of said coating layer are then removed from said surface by a development solvent.

29. The method of claim 28 in which the exposure time is no more than 2 minutes with a 400 watt mercury vapor lamp at 17 inches, and the removal is by a development solvent in no more than 5 minutes.

30. The method of claim 28 in which the unexposed surfaces are removed by use of trichloroethylene solvent and the interpolymer in the light sensitive element has 40 to 50 parts by weight units for acrylonitrile and 60 to 50 parts by weight units from butadiene or isoprene.

31. The method of claim 28 in which the support has a metal surface and after the removal of the unexposed portions the resulting uncovered portions are etched away to the degree desired.

32. The method of claim 28 in which a printed circuit board is made by photoimaging a support which has a copper surface and the copper is etched away with ferric chloride solution to leave unetched portions of copper as a circuit, and removing the remaining portion of the coating layer.

33. The method of claim 28 in which the coating is applied to the surface in liquid form.

34. The method of claim 28 in which the coating layer is applied by lamination as a solid film.

35. The method of claim 28 in which the resulting image comprises a printing plate.

36. The method of claim 28 in which the coating layer consists essentially of the components defined in claim 1.

37. A photosensitive coating composition comprising a solid, non-tacky solvent-soluble interpolymer of an alkenyl nitrile and a hydrocarbon diene, and a photosensitizer which is an aromatic poly-nuclear compound having at least one intracyclic carbonyl group and another intracyclic group selected from the group consisting of sulfur, carbonyl and aza groups and characterized by the absence of polymerizable monomers.

* * * * *